United States Patent [19]
Hatta

[11] Patent Number: 6,032,724
[45] Date of Patent: Mar. 7, 2000

[54] TEMPERATURE CONTROL APPARATUS FOR SAMPLE SUSCEPTOR

[75] Inventor: Masataka Hatta, Yamanashi-ken, Japan

[73] Assignee: Tokyo Electron Limited, Tokyo, Japan

[21] Appl. No.: 08/935,913

[22] Filed: Sep. 23, 1997

[30] Foreign Application Priority Data

Oct. 29, 1996 [JP] Japan .................................. 8-303898

[51] Int. Cl.$^7$ .................................................. C23F 1/02
[52] U.S. Cl. ...................... 165/80.2; 165/80.1; 165/80.4; 156/345; 118/724; 118/725
[58] Field of Search ..................... 62/5, 259.2; 165/80.1, 165/80.2; 374/11; 118/725, 724; 156/345

[56] References Cited

U.S. PATENT DOCUMENTS

| | | | |
|---|---|---|---|
| 4,734,872 | 3/1988 | Eager et al. | 364/557 |
| 5,180,000 | 1/1993 | Wagner et al. | 165/80.1 |
| 5,198,752 | 3/1993 | Miyata et al. | 374/11 |
| 5,228,501 | 7/1993 | Tepman et al. | 165/80.1 |
| 5,343,938 | 9/1994 | Schmidt | 165/80.2 |
| 5,567,267 | 10/1996 | Kazama et al. | 165/80.2 |
| 5,595,241 | 1/1997 | Jelinek | 165/80.2 |
| 5,682,749 | 11/1997 | Bristow et al. | 62/5 |
| 5,749,231 | 5/1998 | Tunkel et al. | 62/5 |
| 5,766,363 | 6/1998 | Mizuno et al. | 118/725 |
| 5,775,416 | 7/1998 | Heimanson et al. | 165/80.2 |
| 5,778,968 | 7/1998 | Hendrickson et al. | 165/80.1 |
| 5,778,969 | 7/1998 | Kyung et al. | 165/80.1 |
| 5,902,407 | 5/1999 | DeBoer et al. | 118/725 |

FOREIGN PATENT DOCUMENTS 6-87475  11/1994  Japan .

*Primary Examiner*—Ira S. Lazarus
*Assistant Examiner*—Terrell McKinnon
*Attorney, Agent, or Firm*—Oblon, Spivak, McClelland, Maier & Neustadt, P.C.

[57] ABSTRACT

A temperature control apparatus for a sample susceptor is described, the temperature control apparatus is easy to maintain, which can set a temperature in a wide range from a low temperature to a high temperature, which is compact and which does not require a special processing for disposing of a cooling medium.

A temperature control apparatus for a sample susceptor has a cooling unit for cooling a sample susceptor on which a wafer W is mounted, an electric heater for heating the sample susceptor, a temperature detecting unit for detecting the temperature of the sample susceptor, and a temperature adjusting unit for controlling the cooling unit and the heating unit based on a detection signal of the temperature detecting unit. The cooling unit has an electro-pneumatic regulator for generating a high-pressure gas of a predetermined pressure from a received gas and supplying the generated high-pressure gas by an electric control, and a vortex tube for generating a low-temperature gas based on a vortex flow generated by receiving a high-pressure gas in the tangent direction within the tube and for supplying this low-temperature gas, so that the low-temperature gas is supplied from the vortex tube to a gas flow path formed within the sample susceptor.

9 Claims, 3 Drawing Sheets

TEMPERATURE CONTROL APPARATUS FOR SAMPLE SUSCEPTOR

BACKGROUND OF THE INVENTION

The present invention relates to an apparatus for controlling the temperature of a susceptor for mounting a sample thereon in an inspecting apparatus, for example.

A sample susceptor has so far been widely used as a table for mounting thereon a sample in a plasma processing unit or an inspecting apparatus. In an inspecting apparatus such as a probing apparatus in the semiconductor manufacturing field, for example, a large number of IC chips formed on a semiconductor wafer (hereinafter to be referred to as a wafer) are inspected for their electrical characteristics at the stage of a semiconductor wafer. By selectively classifying the IC chips into passes and failures, their productivity at the final stage is being improved.

The IC chips manufactured into commercial products as a semiconductor apparatus are used under various weather conditions. Therefore, even at the inspection stage, electrical inspections of the wafers are carried, out under various temperature conditions by taking into account these weather conditions. In order to set these temperature conditions, a temperature control unit is provided in the sample susceptor.

The temperature control apparatus for the conventional sample susceptor circulates the cooling medium by using the refrigerator, the pump and the tank in order to cool the susceptor. Accordingly, the conventional temperature control apparatus has a problem in that the cooling facilities become a large scale. There is a risk that the cooling liquid will leak out from the connection of the piping of the temperature control apparatus. Therefore, the conventional temperature control apparatus has a problem of providing measures for avoiding a leakage of the cooling liquid. Further, in order to keep constant the cooling capacity of the cooling liquid, quality management of the cooling liquid and management of using quantity of the cooling liquid are necessary. Moreover, if the quality of the cooling liquid is deteriorated during the period, this must be disposed of as a waste material. Thus, the conventional apparatus has the problem of involving extreme troublesome maintenance work for the cooling facilities.

BRIEF SUMMARY OF THE INVENTION

It is an object of the present invention to solve the above-described problems.

Further, it is another object of the present invention to make it possible to control the temperature of the susceptor during the period while a predetermined inspection or a predetermined processing is being carried out for a sample mounted on the susceptor.

Further, it is another object of the present invention to make compact the cooling facilities to reduce the installation space.

Further, it is another object of the present invention to be able to set the temperature of the sample susceptor at a wide range from a low temperature not higher than the normal temperature to a high temperature.

Further, it is another object of the present invention to provide a temperature control apparatus for a sample susceptor which does not require taking measures for avoiding a leakage of the cooling medium and which rarely requires maintenance of the cooling facilities.

Further, it is another object of the present invention to provide a temperature control apparatus which does not require a special processing for the disposal of the cooling medium by using air, for example, for the cooling medium to thereby avoid damaging of the environment.

Further, it is still another object of the present invention to improve a temperature control unit of a susceptor for mounting a semiconductor wafer thereon in a probing apparatus for measuring and inspecting electrical characteristics of the semiconductor wafer.

The invention described in claims 1 to 5 relates to a temperature control apparatus for a susceptor for mounting a sample thereon, including a cooling unit for cooling a susceptor for mounting a sample thereon, a heating unit for heating the susceptor, a temperature detecting unit for detecting a temperature of the susceptor, and a temperature control unit for controlling the cooling unit and the heating unit based on a detection signal of the temperature detecting unit.

The invention described in claim 1 is characterized in that a susceptor for mounting a sample thereon has a plurality of gas flow paths allowing low-temperature air for cooling to pass therethrough, wherein these gas flow paths have a common low-temperature air receiving section and respective exhaust ports with the gas flow paths extending in a zig zag fashion between the common low-temperature air receiving section and the respective exhaust ports, and with the gas flow paths being flirter provided in respective fan-shaped regions and further characterized in that the cooling unit in the temperature control apparatus is a cooling apparatus having an electro-pneumatic regulator for generating a high-pressure air of a predetermined pressure from a received air and for supplying this high-pressure air, and a vortex tube supplied with the high-pressure air from the electro-pneumatic regulator for in a tangent direction and, as a result, for generating a low-temperature gas based on a vortex flow generated within the tube and outputting this low-temperature gas to the susceptor.

The invention described in claim 2 is characterized in that the cooling temperature generated by the cooling unit is controlled by controlling the pressure of the high-pressure air supplied from the electro-pneumatic regulator to the vortex tube.

The invention described in claim 3 is characterized in that the vortex tube in the cooling unit outputs a low-temperature air of not higher than the normal temperature to the susceptor.

The invention described in claim 4 is characterized in that the heating unit is an electric heater.

The invention described in claim 5 is characterized in that the heating unit is a unit which utilizes a high-temperature air to be exhausted from the vortex tube in the cooling unit.

The invention described in claim 6 relates to a method of detecting a temperature of a susceptor for mounting a sample thereon where the susceptor has a plurality of gas flow paths allowing low temperature air for cooling to pass therethrough, wherein the gas flow paths have a common low-temperature air receiving section and respective exhaust ports and extend in a zig zag fashion between the common low-temperature air receiving section and the respective exhaust ports, with the gas flow paths being further provided in respective fan-shaped regions and controlling the temperature of the susceptor based on the detected temperature, and is characterized in that a cooling process to be implemented when the detected temperature is higher than a predetermined temperature includes the steps of: supplying an air to an electro-pneumatic regulator so as to generate a high-pressure air of a predetermined pressure from the electro-pneumatic regulator; supplying the high-pressure air from the electro-pneumatic regulator into a tube of a vortex tube in a tangent direction and, as a result, generating a low-temperature air based on a vortex flow generated within the tube; and outputting the low-temperature air from the vortex tube to the susceptor.

The invention described in claims 7 to 9 relates to an improvement of a temperature control unit of a susceptor for mounting a semiconductor wafer thereon in a probing apparatus for measuring and inspecting electrical characteristics of the semiconductor wafer.

The invention described in claim 7 is characterized in that, a susceptor for mounting a sample thereon has a plurality of gas flow paths allowing low-temperature air for cooling which is received at a common low-temperature air receiving section to pass through the gas flow paths extending in zig zag fashion between this common low-temperature air receiving section and respective exhaust ports, where the gas flow paths are further provided in respective fan-shaped regions and further characterized in that; the cooling unit in the temperature control apparatus is a cooling unit including an electro-pneumatic regulator for generating a high-pressure air of a predetermined pressure from a received gas (air) and for supplying this high-pressure air, to a vortex tube from the electro-pneumatic regulator in a tangent direction and, as a result, for generating a low-temperature gas based on a vortex flow generated within the tube and outputting this low-temperature gas to the susceptor.

The invention described in claim 8 is characterized in that the susceptor is a susceptor for mounting a wafer thereon by vacuum adsorbing the wafer.

The invention described in claim 9 is characterized in that the susceptor is a susceptor for mounting thereon an object of which electrical characteristics are inspected by an electrical characteristics inspecting unit, with the susceptor being movable in X, Y, Z and θ directions.

Additional objects, and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 4:
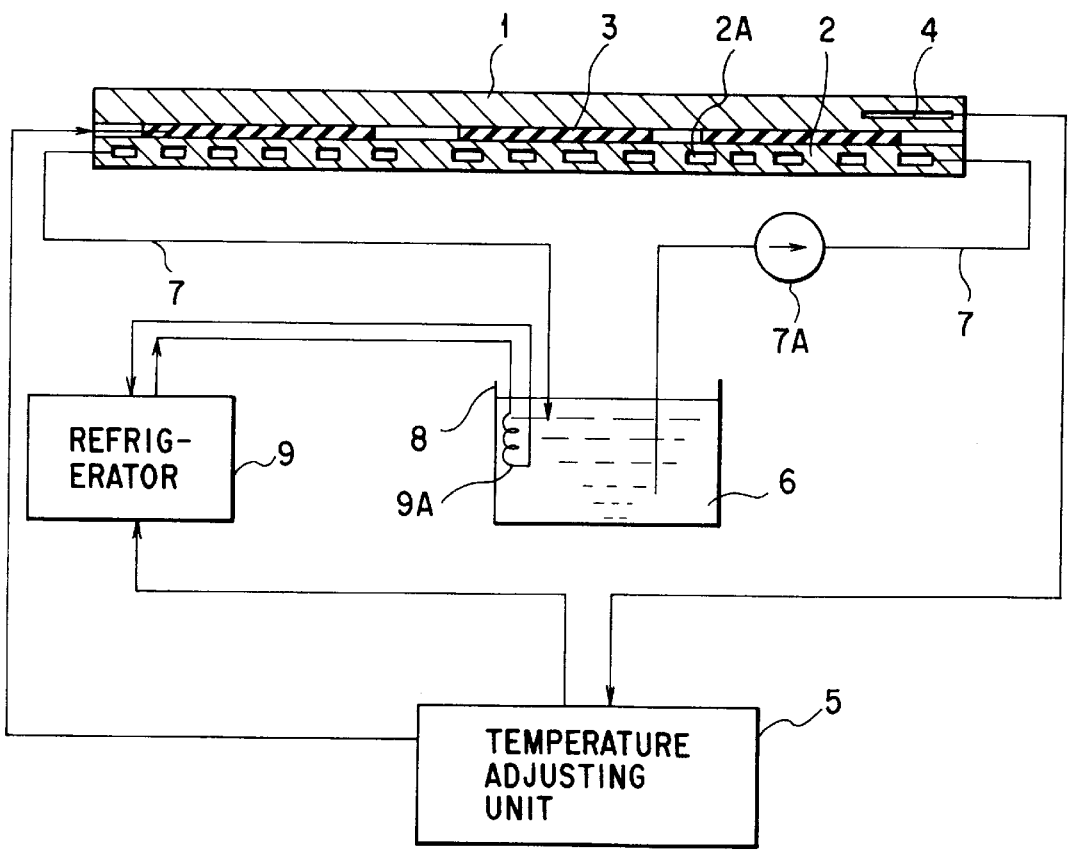
FIG. 4 is a block diagram for showing a structure of one example of a conventional sample susceptor.

A temperature control apparatus of the conventional sample susceptor will be explained below with reference to FIG. 4. FIG. 4 is a diagram for showing one example of the temperature control apparatus for a sample susceptor applied to a probing apparatus. A cooling jacket 2 and an electric heater 3 are built into a sample susceptor 1, and the sample susceptor 1 is cooled or heated by these units. In the sample susceptor 1, a temperature sensor 4 is buried as a temperature detecting unit. The temperature sensor 4 detects a temperature of the sample susceptor 1 and transmits the detected temperature as a detection signal to a temperature adjusting unit 5. The temperature adjusting unit 5 controls the cooling jacket 2 and the electric heater 3 and sets the sample susceptor 1 at various temperatures.

A flow path 2A for flowing a cooling liquid is formed in the cooling jacket 2, and the flow path 2A is connected to a tank 8 through a piping 7. The tank stores a cooling liquid 6 such as an ethylene glycol solution or the like. A pump 7A is disposed in the piping 7 and the cooling liquid 6 circulates between the flow path 2A and the tank 8 by the pump 7A. A heat exchanger 9A for flowing a cooling medium of a refrigerator 9 is disposed in the cooling liquid 6 within the tank 8, and the cooling liquid 6 is cooled through the heat exchanger 9A. The refrigerator 9 is controlled based on a command signal from the temperature adjusting unit 5 so that the cooling liquid 6 is cooled at a predetermined temperature.

The temperature control apparatus for the conventional sample susceptor circulates the cooling medium 6 by using the refrigerator 9, the pump 7A and the tank 8 in order to cool the susceptor 1. Accordingly, the conventional temperature control apparatus has a problem in that the cooling facilities have a large scale. When this temperature control apparatus is applied to an inspecting apparatus such as a probing apparatus, the susceptor 1 generally moves in the X, Y, Z and θ directions during the inspection of a wafer. During this move, the piping 7 repeats bending and extension so that there is a risk that the cooling liquid 6 is leaked out from the connection of the piping 7. Therefore, the conventional temperature control apparatus has a problem of providing measures for avoiding a leakage of the cooling liquid 6. Further, in order to keep constant the cooling capacity of the cooling liquid 6, quality management of the cooling liquid and management of using quantity of the cooling liquid are necessary. Moreover, if the quality of the cooling liquid 6 is deteriorated during the period, this must be disposed of as a waste material. Thus, the conventional apparatus has the problem of involving extremely troublesome maintenance work of the cooling facilities.

MODE OF IMPLEMENTING THE PRESENT INVENTION

The present invention will be explained based on embodiments shown in FIGS. 1 to 3.

Figure 1A:
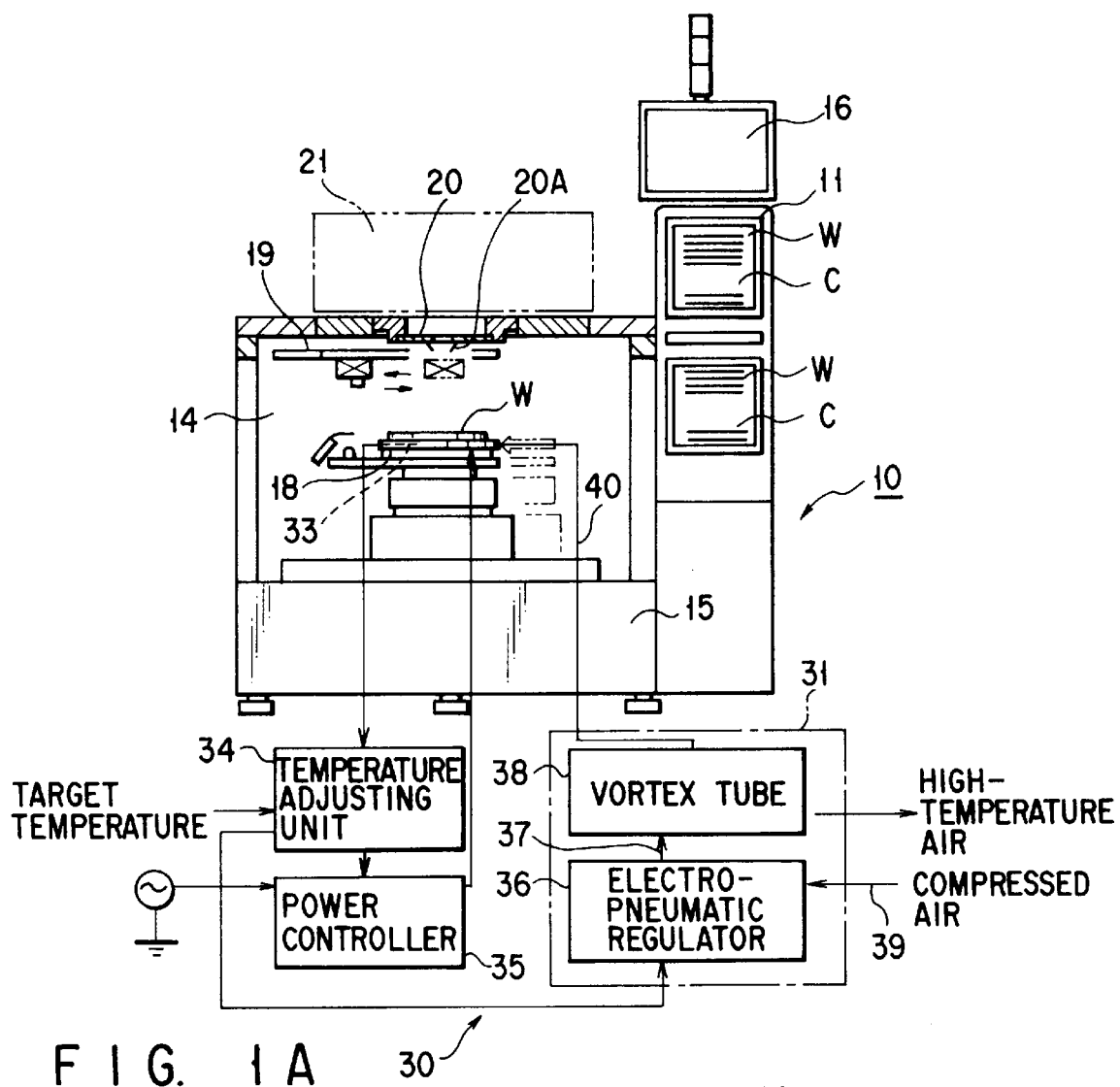
FIG. 1A is a diagram for showing a structure of a mode of implementing a probing unit to which the temperature control apparatus for mounting a sample thereon according to the present invention is applied. This is a front view having the front portion of a prober section broken down and is also a block diagram for showing the structure of the temperature control apparatus of the susceptor.
Figure 1B:
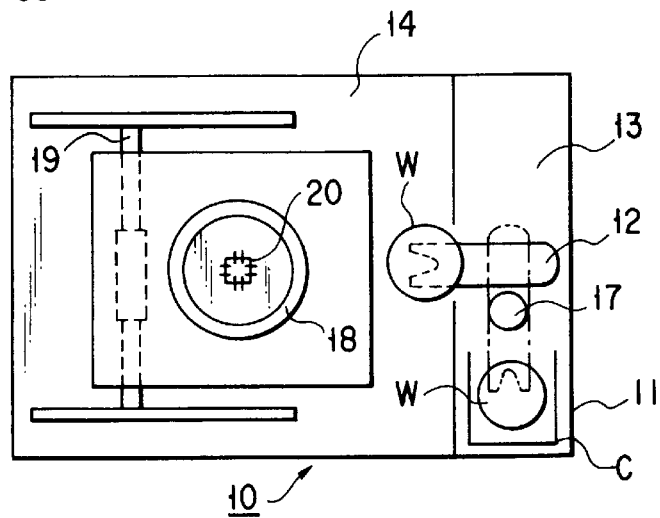
FIG. 1B is a diagram for showing a structure of a mode of implementing a probing unit to which the temperature control apparatus for mounting a sample thereon according to the present invention is also applied, and this is also a top plan view for showing the inside of a loader section and a prober section.

FIGS. 1A and 1B show a probing apparatus to which the temperature control apparatus for the sample susceptor according to the present invention is applied. A probing apparatus 10 has a loader section 13, a prober section 14, a control unit 15 and a display unit 16 which also works as an operation panel for operating the control unit 15, as shown in FIGS. 1A and 1B.

The loader section 13 has a cassette mounting section 11 for mounting a wafer W accommodated within a cassette C and a pair of tweezers 12 for carrying the wafer W on the cassette mounting section 11. The prober section 14 has a prober section 14 for inspecting the wafer W carried through the pair of tweezers 12 of the loader section 13. The control unit 15 controls the apparatus structured by the prober 14 and the loader section 13. The display unit 16 also works as an operation panel for operating the control unit 15. The probing apparatus 10 controls the loader section 13 and the prober section 14 according to a program registered in the control unit 15.

As shown in FIG. 1B, a sub-chuck 17 for pre-aligning the wafer W is disposed in the loader section 13 based on a flat orientation. The sub-chuck 17 pre-aligns the wafer W received from the tweezers 12 and then carries the wafer W to the prober section 14.

In the prober section 14, the wafer W is mounted by vacuum adsorbing to a susceptor (hereinafter to be referred to as a "main chuck") movable in the X, Y, Z and θ directions, an alignment mechanism 19 structured by a CCD camera or the like for positioning the wafer W mounted on the main chuck 18, and a probing card 20 having a plurality of probes 20A for inspecting electrical characteristics of the wafer W. The probing card 20 is fixedly mounted in almost the center of the head plate of the prober section 14. A test head 21 is disposed to be able to move in vortex in the prober section 14. A tester (not shown) is electrically connected with the probing card 20 through the test head 21. A predetermined signal from the tester is transmitted to an electrode pad of an IC chip of the wafer W on the main chuck 18 through the test head 21 and the probes 20A, and the electrical characteristics of the IC chip is measured.

The probing apparatus 10 has a temperature control apparatus 30 for the main chuck 18 as shown in FIG. 1A. The main chuck 18 is controlled at a predetermined temperature within a range from a temperature not higher than a normal temperature to 150° C., for example, by the temperature control apparatus 30, and the electrical characteristics of the wafer W are measured within this temperature range. The temperature control apparatus 30 has a cooling unit 31 for cooling the main chuck 18 on which a sample is mounted, an electric heater 32 (reference FIG. 3B) for heating the main chuck 18, a temperature sensor 33 buried in the vicinity of the mounting surface for detecting the temperature of the main chuck 18, and a temperature adjusting unit 34 for controlling the cooling unit 31 and the electric heater 32 based on a detection signal of the temperature sensor 33, as shown in FIG. 1A, for example. The temperature adjusting unit 34 and the electric heater 32 are connected with each other through a power controller 35 disposed at the back of the probing unit 10. The power controller 35 controls the power supplied to the electric heater 32 based on a command signal of the temperature adjusting unit 34 so as to control the heating temperature of the main chuck 18. A target temperature of the main chuck 18 is set from an operation panel displayed in the display unit 16.

The cooling unit 31 has an electro-pneumatic regulator 36 connected to the temperature adjusting unit 34 and a vortex tube 38, and both are connected to a high-pressure piping 37, as shown in FIG. 1A. As described later, a high-pressure air generated by the electro-pneumatic regulator 36 is supplied to the vortex tube 38, where a low-temperature air is generated and this is supplied to the main chuck 18. The electro-pneumatic regulator 36 is disposed at the back of the probing apparatus 10, for example.

The electro-pneumatic regulator 36 is supplied with air through an air piping 39 from an air source (not shown). The electro-pneumatic regulator 36 generates a high-pressure air of a desired pressure based on a command signal from the temperature adjusting unit 34, and supplies this high-pressure air to the vortex tube 38 through the high-pressure piping 37. A constant proportional relationship exists between the pressure of the high-pressure air generated, by the electro-pneumatic regulator 36 and the supplied power. By suitably setting the supplied power, a high-pressure air of a desired pressure can be obtained. As a result, it becomes possible to control the temperature of a low-temperature air generated by the vortex tube 38, or the cooling capacity.

Figure 2:
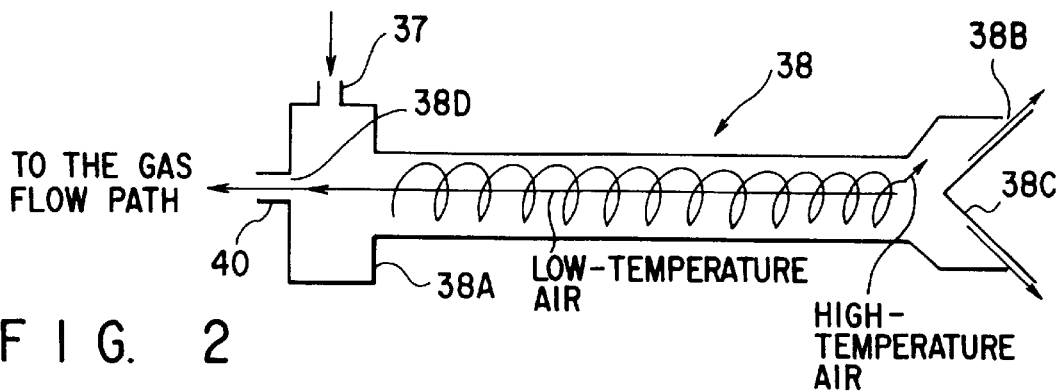
FIG. 2 is a conceptional view for showing a vortex tube.

At one end of the vortex tube 38 (the left end in the drawing), a large diameter section 38A is formed as shown in FIG. 2. On the outer periphery of the large diameter section 38A, the high-pressure piping 37 is connected in the tangent direction of the outer periphery. The high-pressure air supplied from the high-pressure piping 37 flows into the large diameter section 38A as a jet air flow of about the speed of sound, for example, and forms a high-speed vortex flow within the tube. A control valve 38c is mounted on a right end opening 38B of the vortex tube 38. By adjusting the opening of the control valve 38C, its exhaust quantity is adjusted. The vortex tube 38 is arranged adjacent to the main chuck 18, for example, and can move integrally with the main chuck 18.

The operation of the vortex tube 38 will be explained below. As shown in FIG. 2, a high-pressure air of around 30° C., for example, flows into the large diameter section 38A from the high-pressure piping 37. Within the tubing of the large diameter section 38A, a vortex flow of the high-pressure air is formed. The high-pressure air moves to the right end by circulating within the tube, in the process of which the pressure of the high-pressure air is lowered while moving from the left end to the right end. During this period, the temperature of the air increases in the vicinity of the wall inside the tube and a heated wind is generated, and at the vicinity of the core axis of the tube, the temperature of the air is lowered so that a cold wind is generated, thus generating a temperature separation phenomenon. The cold wind flows from the flow exit 38D at the left end of the tube as a low-temperature air of around −30° C., for example, and the hot wind flows out as a high-temperature air of around 90° C. from the right end opening 38B of the tube according to the aperture of the control valve 38C. The temperature of the low-temperature air flown from the vortex tube 38 can be controlled to be lowered to a temperature of a minus range by adjusting the flow quantity of the hot wind by the control valve 38C.

A low-temperature piping 40 is connected to the flow exit 38D of the low-temperature air of the vortex tube 38, as shown in FIG. 1A, and the low-temperature air is supplied to the gas flow path 18A (reference FIG. 3A) formed within the main chuck 18. The main chuck 18 can also be cooled to below the normal temperature by the low-temperature air. The supply temperature of the low-temperature air can be suitably set by the control valve 38C as described above.

Figure 3A:
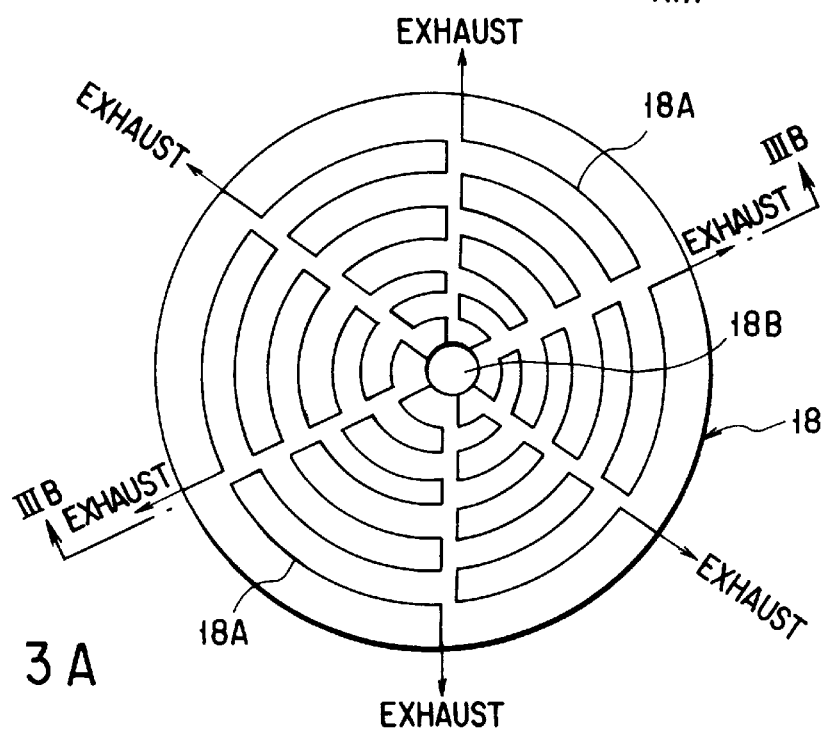
FIG. 3A is an enlarged view for showing the susceptor, and is also a top plan view for showing the structure of a gas flow path formed inside the susceptor.
Figure 3B:
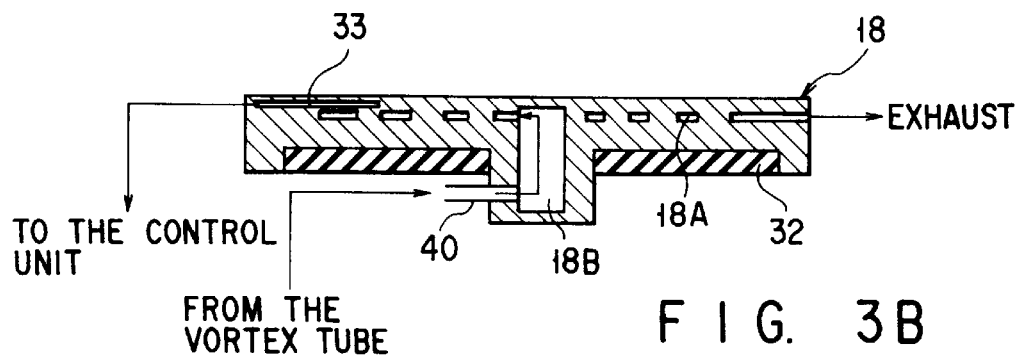
FIG. 3B is a cross-sectional view of FIG. 3A cut along the IIIB—IIIB line.

As show in FIGS. 3A and 3B, the gas flow path formed within the main chuck 18 is divided into six at a fan-shaped section, and the divided paths are formed mutually independent of each other extending to the outside by making a zig-zag movement in the radius direction from the center side.

The inner end of the gas flow path 18A is opened at an air receiving section 18B formed at the center of the main chuck 18, and the outer end is opened at periphery of the main chuck 18. The low-temperature piping 40 is connected to the gas receiving section 18B. The low-temperature air is supplied from the air receiving section 18B to the gas flow path 18A at six positions through the low-temperature piping 40. The low-temperature air supplied at the air receiving section 18B is divided into each gas flow path to cool uniformly the whole surface of the mounting surface of the main chuck 18. The air after the cooling is exhausted from the opening of the periphery of the main chuck 18.

The apparatus shown in FIGS. 1A and 1B will be explained. The case of inspecting the wafer W at the temperature of 70° C., for example, will be explained. A target temperature of 70° C. is input from the operation panel of the display unit 16. Thus, the target temperature of the temperature adjusting unit 34 is set at 70° C. When the target temperature has been set, the temperature adjusting unit 34 compares the current temperature of the main chuck shown by a detection signal from the temperature sensor 33 with the target temperature. Based on the result of comparison, an calculating section calculates heat quantity necessary for the heating or cooling and transmits a command signal according to the heat quantity to the power controller 35 or the electro-pneumatic regulator. The power controller 35 or the electro-pneumatic regulator controls the electric heater 32 or the electro-pneumatic regulator based on the command signal and holds the temperature of the main chuck 18 at the target 70° C.

Within the loader 13 of the probing apparatus 10, the pair of tweezers 12 take out one piece of wafer W from the cassette C and delivers this wafer W to the sub-chuck 17. The sub-chuck 17 pre-aligns the wafer W based on the orientation flat. After the pre-alignment, the tweezers 12 draw the wafer W from the sub-chuck 17 and delivers the wafer W to the main chuck 18 within the prober section 14.

Within the prober section 14, the main chuck 18 moves in the X, Y, Z and θ directions, and the alignment mechanism 19 detects the position of the wafer W during this move. Based on a signal of the detected position, the calculating section of the control unit 15 specifies the size of wafer W and the center position. The alignment mechanism 19 matches positions between the probes 20A of the probing card 20 and the electrode pad of the IC chip which becomes the basis on the wafer W, at a plurality of positions. During this period, the wafer W is heated or cooled by the main chuck 18 to be set at the target temperature of 70° C. After the alignment, the wafer W is sent sequentially in index from the IC chip as the starting point so that each IC chip of the wafer W is measured sequentially. After all the IC chips have been inspected, the wafer W is returned to within the cassette C along the opposite route to the above. Then, all the wafers W within the cassette C are inspected in a similar manner.

The case of inspecting the wafer W of a temperature equal to or above the normal temperature at a temperature not higher than the normal temperature (for example, 0° C.) will be explained. A target temperature of 0° C. is input to the operation panel of the display unit 16. The temperature adjusting unit 34 compares the current temperature of the main chuck 18 with the target temperature, and transmits a command signal to the electro-pneumatic regulator 36 based on a result of the comparison. The electro-pneumatic regulator 36 generates a high-pressure air of a predetermined pressure based on this command signal. This high-pressure air is supplied to the vortex tube 38 through the high-pressure piping 37. In the vortex tube 38, a temperature separation phenomenon occurs based on the vortex flow of the high-pressure air, as described above. By this temperature separation phenomenon, a high-temperature air is exhausted from the right end opening 38B of the vortex tube 38 and a low-temperature air is exhausted from the opening 38D.

The low-temperature air flown from the vortex tube 38 is supplied to the air receiving section 18B of the main chuck 18 through the low-temperature piping 40. The low-temperature air of the air receiving section 18B is distributed to the gas flow path 18A at the six positions. While the low-temperature air flows through the gas flow path 18A from the inner end to the outer end, the low-temperature air cools the main chuck 18 so that the main chuck 18 gradually comes near the target temperature. During this period, the wafer W is moved from the cassette C to the main chuck 18 through the tweezers 12. The electric characteristics of the wafer W at the target temperature are measured in the manner as described above. This inspection is carried out sequentially for all the wafers W on the cassette C.

In the above-described mode of implementation, description has been made of the case where the temperature control apparatus of the present invention is applied to the probing apparatus. However, the temperature control apparatus of the present invention can also be applied for the temperature control of a general sample susceptor.

In the above-described mode of implementation, description has been made of the case where the temperature of the sample susceptor is set at 70° C. and 0° C. respectively. However, the temperature of the sample susceptor is not limited to these temperatures.

In the above-described mode of implementation, description has been made of the case where the electric heater is used as means for heating the sample susceptor. However, as the heating unit, other means can also be utilized such as a unit for utilizing a high-temperature air to be exhausted from the right end opening 38B of the vortex tube 38, for example.

In the above-described mode of implementation, description has been made of the case where the main chuck is used as the sample susceptor. However, the sample susceptor of the present invention is not limited to the main chuck, but the present invention can also be applied to a sample susceptor in wider meaning.

As explained above, according to the present invention, since the electro-pneumatic regulator and the vortex tube are used as the cooling means for the sample susceptor, the cooling facilities can be made substantially compact as compared with the conventional cooling facilities, so that the installation space can be reduced.

Further, according to the present invention, the temperature of the susceptor can also be controlled during the period while a predetermined inspection or a predetermined processing is being carried out for the sample mounted on the susceptor.

Further, according to the present invention, the cooling facilities can also be made compact to thereby reduce the installation space.

According to the present invention, since the electro-pneumatic regulator and the vortex tube are used as the cooling means for the sample susceptor, it becomes possible to lower the temperature of the sample susceptor to a level not higher than the normal temperature so that a temperature setting in a wide range from a low temperature to a high temperature becomes possible.

Further, according to the present invention, since a cooling liquid is not used but air is used as a cooling medium for the sample susceptor, it is not necessary to take measures for avoiding a liquid leakage so that the maintenance of the cooling means becomes easy.

Further, according to the present invention, since air is used, for example, as a cooling medium, a special processing is not necessary for disposing of the cooling medium so that the environment is not damaged.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A temperature control apparatus, comprising:
    a susceptor for mounting a sample thereon, said susceptor having a plurality of gas flow paths, said gas flow paths allowing low-temperature air for cooling to pass therethrough, said gas flow paths having a common low-temperature air receiving section provided on a center portion of the susceptor and respective exhaust ports, said gas flow paths extending in a zig zag fashion between said common low temperature air receiving section and said respective exhaust ports, and said gas flow paths being provided in respective fan-shaped regions;
    a cooling unit configured to cool said susceptor, said cooling unit including an electro-pneumatic regulator for generating high-pressure air of a predetermined pressure from received air and a vortex tube supplied with said high-pressure air from said electro-pneumatic regulator in a tangent direction and, as a result, generating a low-temperature air flow based on a vortex flow generated within said vortex tube and outputting said low-temperature air flow to said common low-temperature air receiving section of said susceptor;
    a heater configured to heat said susceptor;
    a temperature detector configured to detect a temperature of said susceptor; and
    a temperature adjusting unit configured to control said cooling unit and said heater based on a detection signal from said temperature detector.

2. A temperature control apparatus according to claim 1, wherein
    a cooling temperature generated by said cooling unit is controlled by controlling a pressure of said high-pressure air supplied from said electro-pneumatic regulator to said vortex tube.

3. A temperature control apparatus according to claim 1, wherein
    said vortex tube in said cooling unit outputs a low-temperature air of not higher than a normal temperature to said susceptor.

4. A temperature control apparatus according to claim 1, wherein
    said heating heater is an electric heater.

5. A temperature control apparatus according to claim 1, wherein
    said heater is configured to supply high-temperature air exhausted from said vortex tube in said cooling unit.

6. A method of detecting a temperature of a susceptor for mounting a sample thereon and controlling said temperature of said susceptor based on said detected temperature, said susceptor having a plurality of gas flow paths, said gas flow paths allowing low-temperature air for cooling to pass therethrough, said gas flow paths having a common low-temperature air receiving section provided on a center portion of the susceptor and respective exhaust ports, said gas flow paths extending in a zig zag fashion between said common low-temperature air receiving section and said respective exhaust ports, and said gas flow paths being provided in respective fan-shaped regions, wherein a cooling process to be implemented when said detected temperature is higher than a predetermined temperature comprises:
    supplying air to electro-pneumatic regulator so as to generate high-pressure air of a predetermined pressure from said electro-pneumatic regulator;
    supplying said high-pressure air from said electro-pneumatic regulator into a vortex tube in a tangent direction and, as a result, generating a low-temperature air flow based on a vortex flow generated within said tube; and
    outputting said low-temperature air flow from said vortex tube to said common low-temperature air receiving section of said susceptor.

7. A probing apparatus for measuring and inspecting electrical characteristics of a semiconductor wafer, comprising:
    a susceptor having a plurality of gas flow paths, said gas flow paths allowing low-temperature air for cooling to pass therethrough, said gas flow paths having a common low-temperature air receiving section provided on a center portion of the susceptor and respective exhaust ports, said gas flow paths extending in a zig zag fashion between said common low-temperature air receiving section and said respective exhaust ports, and said gas flow paths being provided in respective fan-shaped regions;
    a cooling unit, including an electro-pneumatic regulator for generating a high-pressure air of a predetermined pressure for cooling said susceptor configured to mount said semiconductor wafer thereon, and a vortex tube supplied with said high-pressure air from said electro-pneumatic regulator in a tangent direction and, as a result, generating a low-temperature air flow based on a vortex flow generated within said vortex tube and outputting this low-temperature air flow to said common low-temperature air receiving section of said susceptor;
    a heater configured to heat said susceptor;
    a temperature detector configured to detect a temperature of said susceptor; and
    a temperature adjusting unit configured to control said cooling unit and said heater based on a detection signal from said temperature detector.

8. A probing apparatus according to claim 7, wherein said susceptor is a susceptor for mounting a semiconductor wafer thereon by vacuum adsorbing said semiconductor wafer.

9. A probing apparatus according to claim 7, wherein said susceptor is a susceptor for mounting thereon an object of which electrical characteristics are inspected by electrical characteristics inspecting unit, with said susceptor being movable in X, Y, Z and θ directions.

* * * * *